United States Patent
Wang et al.

(10) Patent No.: US 8,711,535 B2
(45) Date of Patent: Apr. 29, 2014

(54) ESD PROTECTION CIRCUIT AND ESD PROTECTION DEVICE THEREOF

(71) Applicant: United Microelectronics Corp., Hsin-Chu (TW)

(72) Inventors: Chang-Tzu Wang, Taipei (TW); Tien-Hao Tang, Hsinchu (TW); Kuan-Cheng Su, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/891,199

(22) Filed: May 10, 2013

(65) Prior Publication Data
US 2013/0250462 A1   Sep. 26, 2013

Related U.S. Application Data

(62) Division of application No. 12/981,521, filed on Dec. 30, 2010, now Pat. No. 8,467,162.

(51) Int. Cl.
*H02H 3/20* (2006.01)
*H01L 27/02* (2006.01)

(52) U.S. Cl.
CPC .............. *H02H 3/20* (2013.01); *H01L 27/0262* (2013.01); *H01L 2924/1301* (2013.01); *H01L 2924/1304* (2013.01)
USPC ............ 361/91.1; 361/56; 257/122; 257/126; 257/355

(58) Field of Classification Search
CPC ............... H01L 27/0262; H01L 2924/1301; H01L 2924/1304
USPC ............... 361/56, 91.1; 257/355, 126, 122
See application file for complete search history.

(56) References Cited

U.S. PATENT DOCUMENTS

| | | | |
|---|---|---|---|
| 5,400,202 A | 3/1995 | Metz | |
| 5,430,595 A | 7/1995 | Wagner | |
| 5,530,612 A | 6/1996 | Maloney | |
| 5,561,577 A | 10/1996 | Motley | |
| 5,780,905 A * | 7/1998 | Chen et al. | 257/355 |
| 5,843,813 A | 12/1998 | Wei | |
| 5,903,420 A * | 5/1999 | Ham | 361/56 |
| 6,671,153 B1 | 12/2003 | Ker | |
| 6,765,771 B2 | 7/2004 | Ker | |
| 6,768,616 B2 * | 7/2004 | Mergens et al. | 361/56 |
| 6,885,529 B2 * | 4/2005 | Ker et al. | 361/56 |
| 6,909,149 B2 | 6/2005 | Russ | |
| 7,110,230 B2 | 9/2006 | Van Camp | |
| 7,672,100 B2 | 3/2010 | Van Camp | |
| 2003/0076636 A1 | 4/2003 | Ker | |

\* cited by examiner

*Primary Examiner* — Rexford Barnie
*Assistant Examiner* — Zeev V Kitov
(74) *Attorney, Agent, or Firm* — Winston Hsu; Scott Margo

(57) ABSTRACT

The ESD protection circuit is electrically connected between a first power rail and a second power rail, and includes an ESD protection device, a switching device electrically connected between the ESD protection device and a first power rail, and a low-pass filter electrically connected between the first power rail and the first switching device. The ESD protection device includes a BJT and a first resistor electrically connected between a base of the BJT and a first power rail. When no ESD event occurs, a potential of the base is larger than or equal to a potential of an emitter of the BJT. When the ESD event occurs, the potential of the base is smaller than the potential of the emitter.

13 Claims, 8 Drawing Sheets

US 8,711,535 B2

ESD PROTECTION CIRCUIT AND ESD PROTECTION DEVICE THEREOF

CROSS REFERENCE TO RELATED APPLICATIONS

This application is a divisional application of and claims the benefit of U.S. patent application Ser. No. 12/981,521, filed Dec. 30, 2010.

BACKGROUND OF THE INVENTION

1. Field of the Invention

The present invention relates to an electrostatic discharge (ESD) protection circuit and an ESD device thereof, and more particularly, to an electrostatic discharge (ESD) protection circuit and an ESD device thereof using a silicon-controlled rectifier (SCR) to discharge ESD current.

2. Description of the Prior Art

Electrostatic discharge (ESD) represents one of the main threats to reliability in semiconductor products, especially in scaled-down CMOS technologies. Due to low breakdown voltage of thinner gate oxide in deep-submicron CMOS technologies, an efficient ESD protection circuit must be designed and placed on every input pad to clamp the overstress voltage across the gate oxide of the internal circuit. However, the ESD protection circuit inevitably introduces negative impacts to RF performance due to their parasitic capacitance. As the operating frequency of RF circuits increases, performance degradation due to ESD protection circuits becomes more serious. Silicon-controlled rectifier (SCR) is demonstrated to be suitable for ESD protection design for RF ICs, because it has both high ESD robustness and low parasitic capacitance under a small layout area.

Referring to FIG. 1 and FIG. 2, FIG. 1 is a schematic diagram illustrating a SCR according to prior art, and FIG. 2 is a schematic diagram illustrating an I-V curve of the SCR. As shown in FIG. 1, the SCR 10 is electrically connected between an input/output (I/O) pad 12 and a ground 14, and has a P-type substrate 16, a N-type well 18 disposed in the P-type substrate 16, a first P-type doped region 20 and a first N-type doped region 22 disposed in the N-type well 18, and a second N-type doped region 24 and a second P-type doped region 26 disposed in the P-type substrate 16. The first P-type doped region 20 and the first N-type doped region 22 are electrically connected to the I/O pad 12, and the second N-type doped region 24 and the second P-type doped region 26 are electrically connected to the ground 14. The SCR 10 provides a discharge path 28 composed of a PNPN structure, and the PNPN structure is formed by the first P-type doped region 20, the N-well 18, the P-type substrate 16 and the second N-type doped region 24 in sequence. As shown in FIG. 2, the SCR 10 has a trigger voltage $V_{tr}$ and a holding voltage $V_H$. When an ESD event occurs on the I/O pad 12, and an ESD voltage is higher than the trigger voltage $V_{tr}$, the SCR 10 is triggered on and into a latch-up state. In the latch-up state, the holding voltage $V_H$ across the SCR 10 is lower than the trigger voltage $V_{tr}$, and the ESD current can be discharged through the discharge path 28. When the ESD event does not occur, the operating voltage inputted to the I/O pad is not larger than the trigger voltage $V_{tr}$, and the SCR cannot be triggered on. Therefore, the SCR is in off state, and an internal circuit connected to the I/O pad 12 can operate normally.

However, during normal operation of the internal circuit, some noise is generated, and at the same time, the operating voltage inputted to the I/O pad is larger than the trigger voltage. Thus, the SCR will be triggered on and into the latch-up state, and the discharge path is opened during normal operation. Accordingly, leakage current passing the discharge path is generated, and the internal circuit cannot operate normally. Therefore, to solve the problem of the SCR being triggered on by the noise during normal operation is an important objective for industry.

SUMMARY OF THE INVENTION

It is one of the objectives of the present invention to provide an electrostatic discharge (ESD) protection circuit and an ESD device to solve the above-mentioned problem in the prior art.

According to a preferred embodiment of the present invention, an ESD protection circuit electrically connected between a first power rail and a second power rail is provided. The ESD protection circuit includes an ESD protection device, a first switching device and a first low-pass filter. The ESD protection device includes a first BJT of a first conductive type and a second BJT of a second conductive type. The first BJT has a first base, a first emitter and a first collector, and the first emitter is electrically connected to the first power rail. The second BJT has a second base, a second emitter and a second collector. The second emitter is electrically connected to the second power rail. The second collector is electrically connected to the first base, and the second base is electrically connected to the first collector. The first switching device is electrically connected between the first base and the first power rail, and the first low-pass filter is electrically connected between the first power rail and the first switching device. When an ESD event does not occur, the first switching device is turned on, and a potential of the first base is larger than or equal to a potential of the first emitter. When the ESD event occurs, the first switching device is turned off, and the potential of the first base is smaller than the potential of the first emitter.

According to a preferred embodiment of the present invention, an ESD protection device is provided. The ESD protection device includes a substrate, a first well, a first doped region, a second doped region and a fifth doped region. The substrate has a first conductive type. The first well has a second conductive type, and is disposed in the substrate. The first well is electrically connected to a first switching device. The first doped region has the first conductive type, and is disposed in the first well. The first doped region and the first well are electrically connected to a first power rail. The second doped region has the second conductive type, and is disposed in the substrate. The second doped region and the substrate are electrically connected to a second power rail. The fifth doped region has the second conductive type, and is disposed in the first well between the first doped region and the second doped region. The first well is electrically connected to the first switching device by the fifth doped region. When an ESD event does not occur, the first switching device is turned on, and a potential of the first well is larger than or equal to a potential of the first doped region. When the ESD event occurs, the first switching device is turned off, and the potential of the first well is smaller than the potential of the first doped region.

According to another preferred embodiment of the present invention, an ESD protection circuit electrically connected between a first power rail and a second power rail is provided. The ESD protection circuit includes an ESD protection device, a second switching device and a second low-pass filter. The ESD protection device includes a first BJT of a first conductive type and a second BJT of a second conductive type. The first BJT has a first base, a first emitter and a first collector, and the first emitter is electrically connected to the first power rail. The second BJT has a second base, a second emitter and a second collector. The second emitter is electrically connected to the second power rail. The second collector is electrically connected to the first base, and the second base is electrically connected to the first collector. The second switching device is electrically connected between the second base and the second power rail, and the second low-pass filter is electrically connected between the second power rail and the second switching device. When an ESD event does not occur, the second switching device is turned on, and a potential of the second base is smaller than or equal to a potential of the second emitter. When the ESD event occurs, the second switching device is turned off, and the potential of the second base is larger than the potential of the second emitter.

According to another preferred embodiment of the present invention, an ESD protection device is provided. The ESD protection device includes a substrate, a first well, a first doped region, a second doped region, a second well and a sixth doped region. The substrate has a first conductive type. The first well has a second conductive type, and is disposed in the substrate. The second well has the first conductive type, and is disposed in the substrate adjacent to the first well. The second well is electrically connected to a second switching device. The first doped region has the first conductive type, and is disposed in the first well. The first doped region and the first well are electrically connected to the first power rail. The second doped region has the second conductive type, and is disposed in the substrate. The second doped region and the second well are electrically connected to the second power rail. The sixth doped region has the first conductive type, and is disposed in the second well between the first doped region and the second doped region. The second well is electrically connected to the second switching device by the sixth doped region. When an ESD event does not occur, the second switching device is turned on, and a potential of the second well is smaller than or equal to a potential of the second doped region. When the ESD event occurs, the second switching device is turned off, and the potential of the second well is larger than the potential of the second doped region.

The present invention provides the switching device and the low-pass filter to be electrically connected between the power rail and the fifth doped region or sixth doped region. The low-pass filter can keep the switching device being turned on during the normal operation, and keep the switching device being turned off during the ESD event. The switching device can turn on the path from the power rail to the fifth doped region or sixth doped region, so that the potential of the fifth doped region is equal to or larger than the potential of the first doped region, or the potential of the sixth doped region is equal to or smaller than the potential of the second doped region during the normal operation. Therefore, the ESD protection device does not be triggered into the latch-up state during the normal operation, and the problem of the ESD protection device being triggered on by the noise during normal operation can be solved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
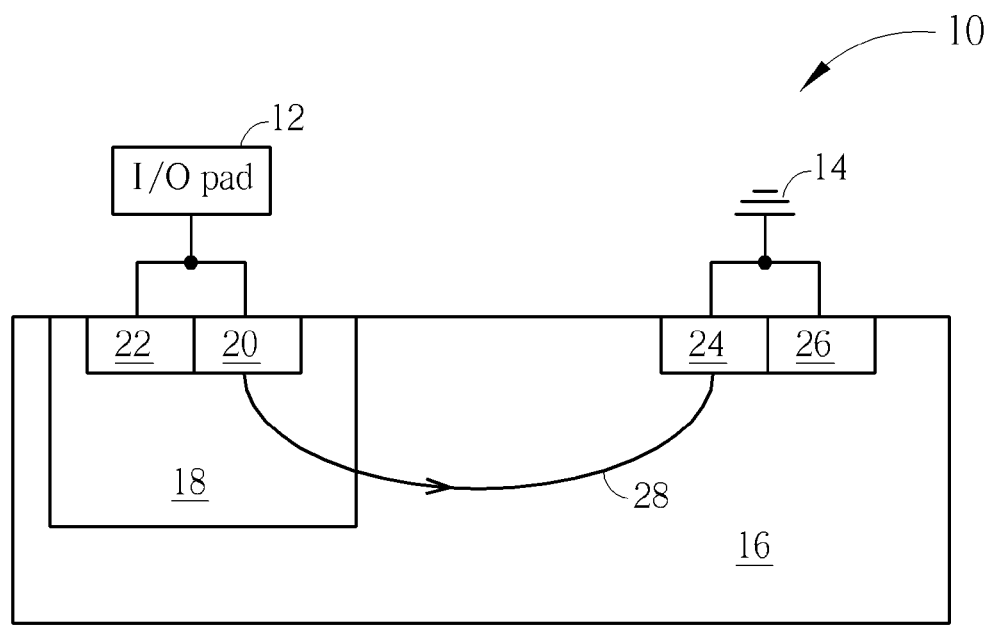
FIG. 1 is a schematic diagram illustrating a SCR according to prior art.
Figure 2:
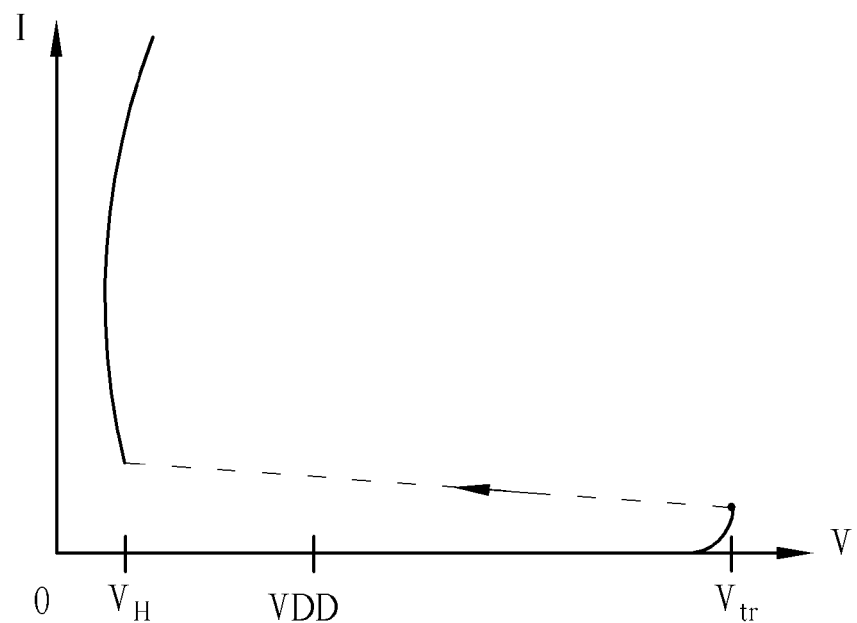
FIG. 2 is a schematic diagram illustrating an I-V curve of the SCR.
Figure 3:
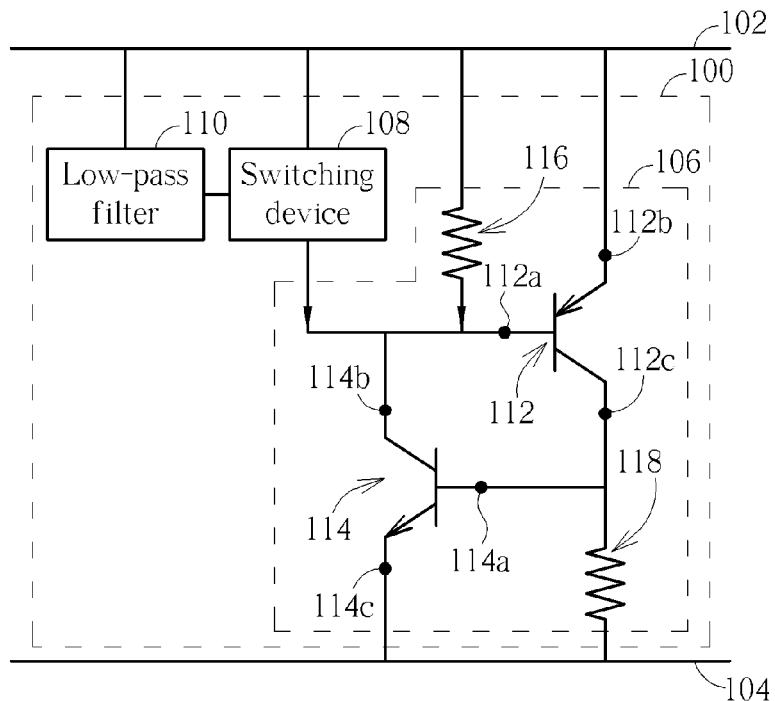
FIG. 3 is a circuit diagram illustrating an ESD protection circuit according to a first preferred embodiment of the present invention.
Figure 4:
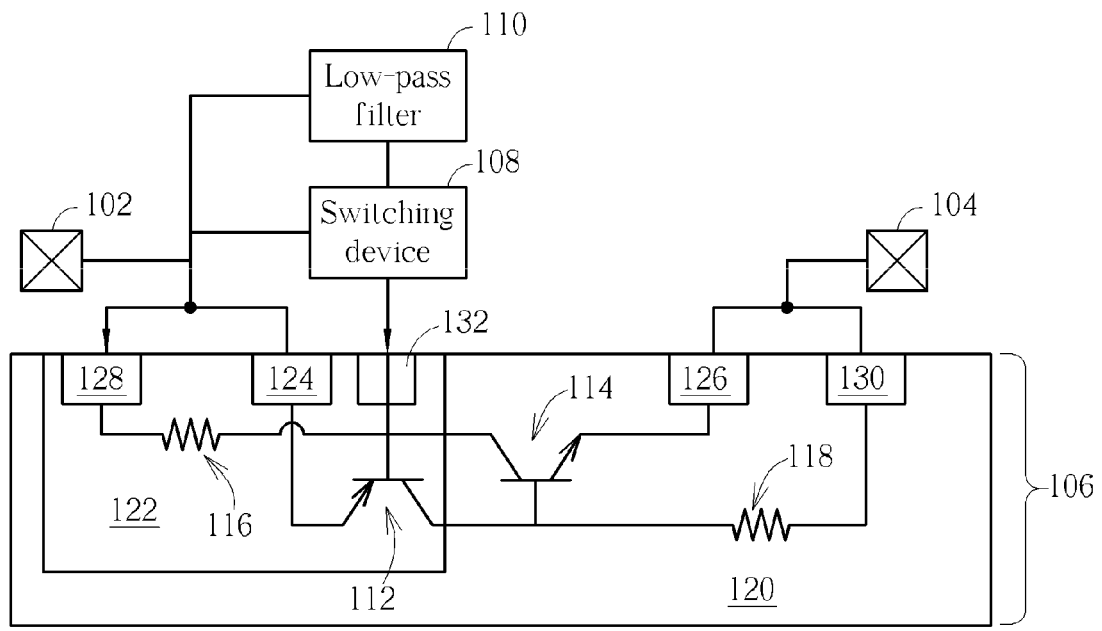
FIG. 4 is a schematic diagram illustrating a cross-sectional view of an ESD protection device according to the first preferred embodiment of the present invention.
Figure 5:
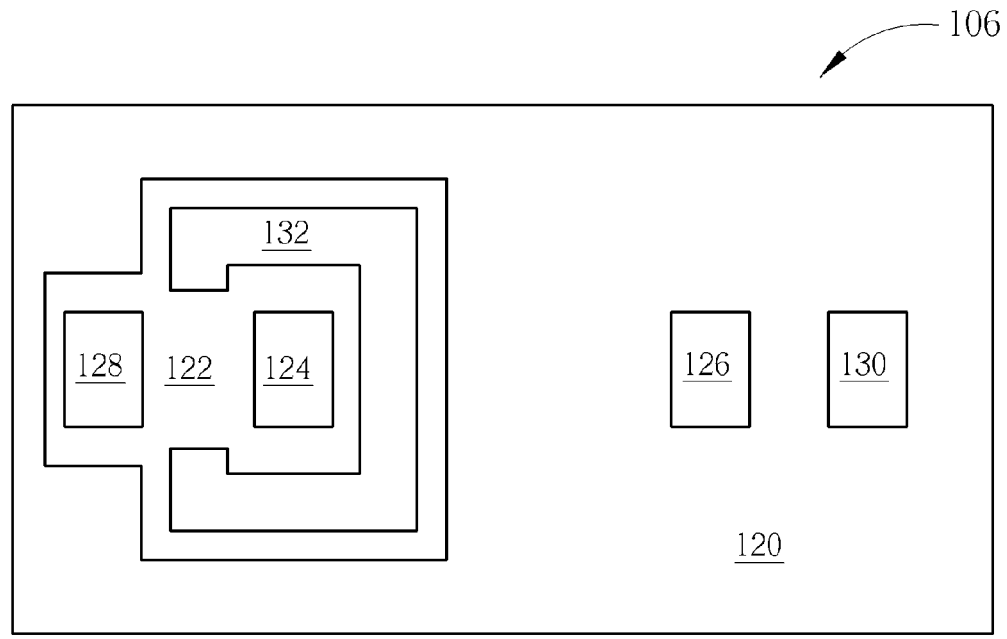
FIG. 5 is a schematic diagram illustrating a top view of the ESD protection device according to the first preferred embodiment of the present invention.

Referring to FIG. 3 through FIG. 5, FIG. 3 is a circuit diagram illustrating an ESD protection circuit according to a first preferred embodiment of the present invention; FIG. 4 is a schematic diagram illustrating a cross-sectional view of an ESD protection device according to the first preferred embodiment of the present invention; and FIG. 5 is a schematic diagram illustrating a top view of the ESD protection device according to the first preferred embodiment of the present invention. As shown in FIG. 3, the ESD protection circuit 100 is electrically connected between a first power rail 102 and a second power rail 104, and the ESD protection circuit 100 includes an ESD protection device 106, a first switching device 108 and a first low-pass filter 110. In this embodiment, the first power rail 102 is high power terminal $V_{DD}$, and the second power rail 104 is low power terminal $V_{SS}$. The present invention is not limited to this, and the first conductive type and the second conductive type can be exchanged. The ESD protection device 106 includes a bipolar junction transistor (BJT) 112 of a first conductive type and a BJT 114 of a second conductive type. In this embodiment, the first conductive type is P-type, and the second conductive type is N-type. The present invention is not limited to this. The P-type BJT 112 has a first base 112a, a first emitter 112b and a first collector 112c, and the N-type BJT 114 has a second base 114a, a second collector 114b and a second emitter 114c. The first emitter 112b is electrically connected to the first power rail 102, and the second emitter 114c is electrically connected to the second power rail 104. The first base 112a is electrically connected to the second collector 114b, and the first collector 112c is electrically connected to the second base 114a. In addition, the ESD protection device 106 further includes a first resistor 116 electrically connected between the first base 112a and the first power rail 102, and a second resistor 118 electrically connected between the second base 114a and the second power rail 104. Furthermore, the first switching device 108 is electrically connected between the first base 112a and the first power rail 102, and the first low-pass filter 110 is electrically connected between the first switching device 108 and the first power rail 102, so that the first switching device 108 can be controlled by a signal passing through the first low-pass filter.

When an ESD event does not occur, the ESD protection circuit 100 is in a normal operation state. A DC voltage signal provided from the first power rail 102 can pass through the first low-pass filter 110, and the first switching device 108 is turned on by the DC voltage signal. Thus, a resistance of the first switching device 108 that is turned on is smaller than a resistance of the first resistor 116, and then, the DC voltage signal is transferred to the first base 112a of the P-type BJT 112 through the first switching device 108. In the P-type BJT 112, a potential of the first base 112a is equal to or larger than a potential of the first emitter 112b, so that the P-type BJT 112 is in off state, and no leakage current is generated in the ESD protection circuit 100. Even some noise signal is generated during the normal operation state, and the noise signal can flow into the first power rail 102 through the first switching device 108. Furthermore, when the ESD event occurs, the ESD current cannot pass through the first low-pass filter 110 because the ESD event has very fast electrical transition in the order of several nanoseconds (ns). Accordingly, the first switching device 104 is turned off, and the ESD current flows into the first base 112a of the P-type BJT 112 through the first resistor 116 that has a resistance lower than the resistance of the first switching device 106 that is turned off. Therefore, the potential of the first base 112a is smaller than the potential of the first emitter 112b, and the ESD protection device can be turned on to discharge the ESD current.

As shown in FIG. 4 and FIG. 5, the ESD protection device 106 of this embodiment includes a substrate 120, a first well 122, a first doped region 124, a second doped region 126 and a third doped region 132. In this embodiment, the first well 122 and the second doped region 126 are disposed in the substrate 120, and the first doped region 124 and the third doped region 132 are disposed in the first well 122. The first doped region 124 and the first well 122 are electrically connected to the first power rail 102, and the second doped region 126 and the substrate 120 are electrically connected to the second power rail 104. In this embodiment, the substrate 120 and the first doped region 124 have the P-type, and the first well 122, the second doped region 126 and the third doped region 132 have the N-type. The present invention is not limited to this, and the N-type and the P-type can be exchanged. As we can see from the above-mentioned, the P-type first doped region 124, the N-type first well 122 and the P-type substrate 120 constitute the P-type BJT 112. The P-type first doped region 124 is regarded as the first emitter 112b. The N-type first well 122 is regarded as the first base 112a. The P-type substrate 120 is regarded as the first collector 112c. Furthermore, the N-type first well 122, the P-type substrate 120 and the N-type second doped region 126 con-stitute the N-type BJT 114. The N-type first well 122 is regarded as the second collector 114b. The P-type substrate 120 is regarded as the second base 114a. The N-type second doped region 126 is regarded as the second emitter 114c. Therefore, the first base 112a can be connected to the second collector 114b, and the first collector 112c can be connected to the second base 114a. The ESD protection device 106 forms a silicon controlled rectifier (SCR), and the P-type first doped region 124, the N-type first well 122, the P-type substrate 120 and the N-type second doped region 126 form a PNPN structure to provide a discharge path discharging the ESD current from the first power rail 102 when the ESD protection device 106 is triggered into a latch-up state. The N-type third doped region 132 is disposed between the P-type first doped region 124 and the N-type second doped region 126. Furthermore, the N-type third doped region 132 extends to partially surround the P-type first doped region 124, and the N-type first well 122 is electrically connected to the first switching device 108 by the N-type third doped region 132.

In this embodiment, the ESD protection device 106 further includes an N-type fourth doped region 128 and a P-type fifth doped region 130. The N-type fourth doped region 128 is disposed in the N-type first well 122, and the P-type first doped region 124 is disposed between the N-type fourth doped region 128 and the N-type second doped region 126. The N-type fourth doped region 128 is electrically connected to the first power rail 102, so that the fourth doped region 128 can electrically connect the N-type first well 122 and the first power rail 102. The N-type first well 122 disposed between the P-type first doped region 124 and the N-type fourth doped region 128 constitutes the first resistor 116. In addition, the N-type third doped region 132 has an opening between the P-type first doped region 124 and the N-type fourth doped region 128. The P-type fifth doped region 130 is disposed in the P-type substrate 120, and the N-type second doped region 126 is disposed between the N-type first well 122 and the P-type fifth doped region 130. The P-type fifth doped region 130 is electrically connected to the second power rail 104, so that the P-type fifth doped region 130 can electrically connect the P-type substrate 120 and the second power rail 104. The P-type substrate 120 disposed between the N-type second doped region 126 and the P-type fifth doped region 130 constitutes the second resistor 118.

When no ESD event occurs, the first switching device 108 is turned on, and the DC voltage can be applied to the third doped region 132. Because the N-type third doped region 132 is disposed around the P-type first doped region 124, the N-type first well 122 around the P-type first doped region 124 and the N-type third doped region 132 can have the same potential. For this reason, the potential of the N-type first well 122 regarded as the first base 112a can be equal to or larger than the potential of the P-type first doped region 124 regarded as the first emitter 112b during no ESD event. Even some noise signal is generated during the normal operation state, and the noise signal can flow into the first power rail 102 through the N-type third doped region 132 and the first switching device 108, so that the ESD protection device 106 can be prevented from being triggered into the latch-up state.

Figure 6:
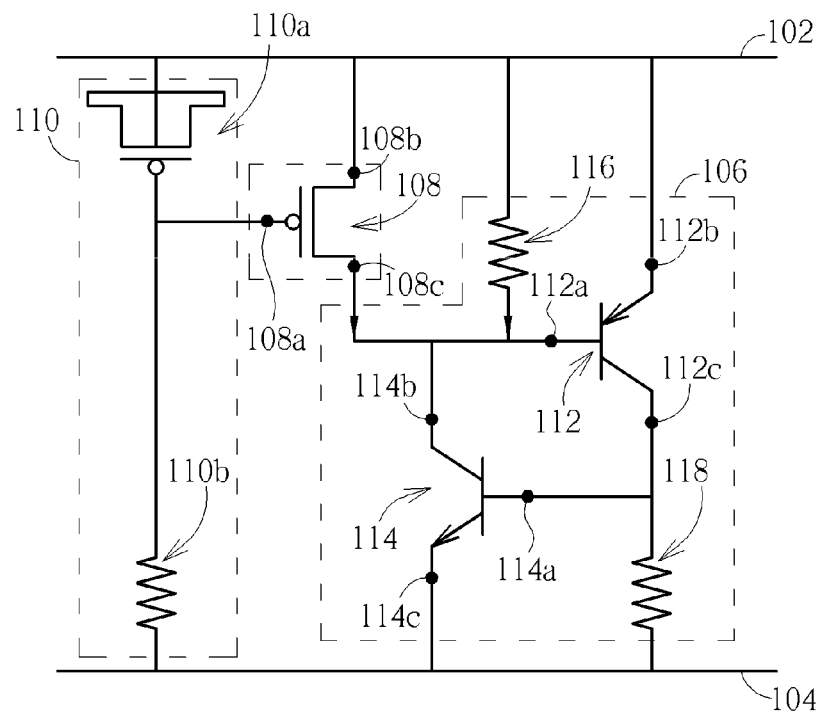
FIG. 6 is a circuit diagram illustrating an example of the ESD protection circuit according to the first preferred embodiment of the present invention.

Referring to FIG. 6 and referring to FIG. 4 together, FIG. 6 is a circuit diagram illustrating an example of the ESD protection circuit according to the first preferred embodiment of the present invention. As shown in FIG. 4 and FIG. 6, the first switching device 108 is a P-type metal-oxide-semiconductor (MOS) transistor, but the present invention is not limited to this. The first switching device 108 has a first gate 108a, a first source 108b and a first drain 108c, and the first gate 108a is electrically connected to the low-pass filter 110. The first source 108b is electrically connected to the first power rail 102, and the first drain 108c is electrically connected to the N-type third doped region, so that the first drain 108c can electrically connected to the first well 122 regarded as the first base 112a of the P-type BJT 112 and the second collector 114b of the N-type BJT 114. Furthermore, the low-pass filter 110 includes a capacitor 110a and a third resistor 110b. The capacitor 110a is electrically connected between the first power rail 102 and the first gate 108a of the first switching device 108, and the third resistor 110b is electrically connected between the first gate 108a of the first switching device 108 and the second power rail 104.

The ESD protection circuit 100 of the present invention is not limited to the above-mentioned embodiment. The following description continues to detail the other embodiments or modifications, and in order to simplify and show the difference between the other embodiments or modifications and the above-mentioned embodiment, the same numerals denote the same components in the following description, and the same parts are not detailed redundantly.

Figure 7:
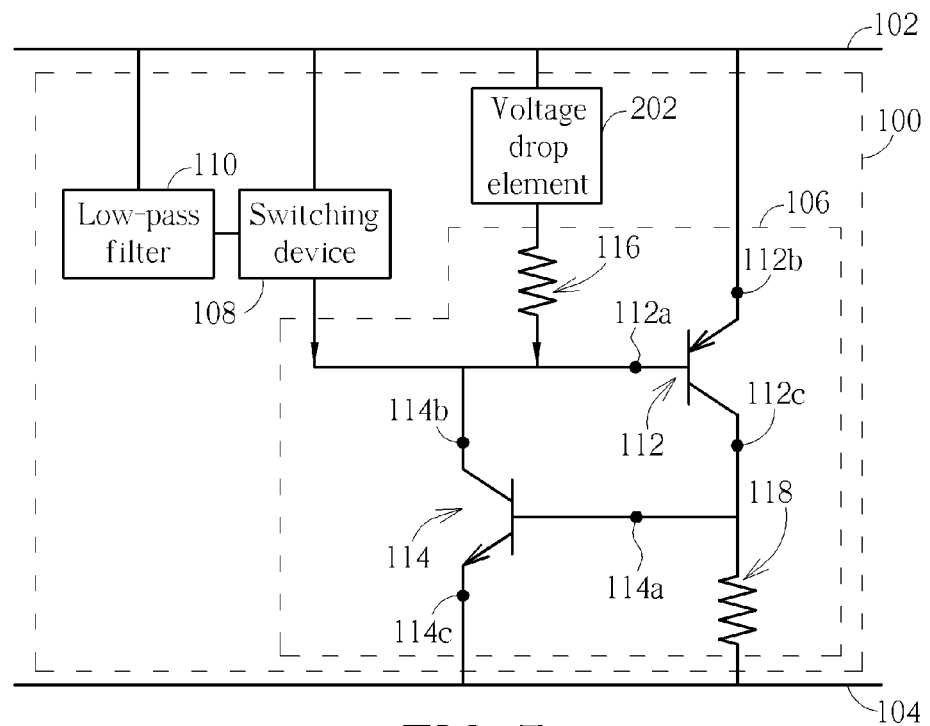
FIG. 7 is a circuit diagram illustrating an ESD protection circuit according to a second preferred embodiment of the present invention.

Referring to FIG. 7, FIG. 7 is a circuit diagram illustrating an ESD protection circuit according to a second preferred embodiment of the present invention. As shown in FIG. 7, as compared with the first preferred embodiment, the ESD protection circuit 200 of this embodiment further includes a voltage drop element 202, and the voltage drop element 202 is electrically connected between the first resistor 116 and the first power rail 102. The voltage drop element 202 provides a voltage drop between the first base 112a and the first emitter 112b, and in combination with a voltage drop provided by the first resistor 116, a voltage difference between the first base 112a and the first emitter 112b in this embodiment is larger than the voltage difference between the first base 112a and the first emitter 112b in the first preferred embodiment. For this reason, during the ESD event, the potential of the first emitter 112b is more easily larger than the potential of the first base 112a, and the ESD protection device 106 in this embodiment is turned on faster than that in the first preferred embodiment. The ESD current in this embodiment can be discharged faster as compared with the first preferred embodiment.

Figure 8:
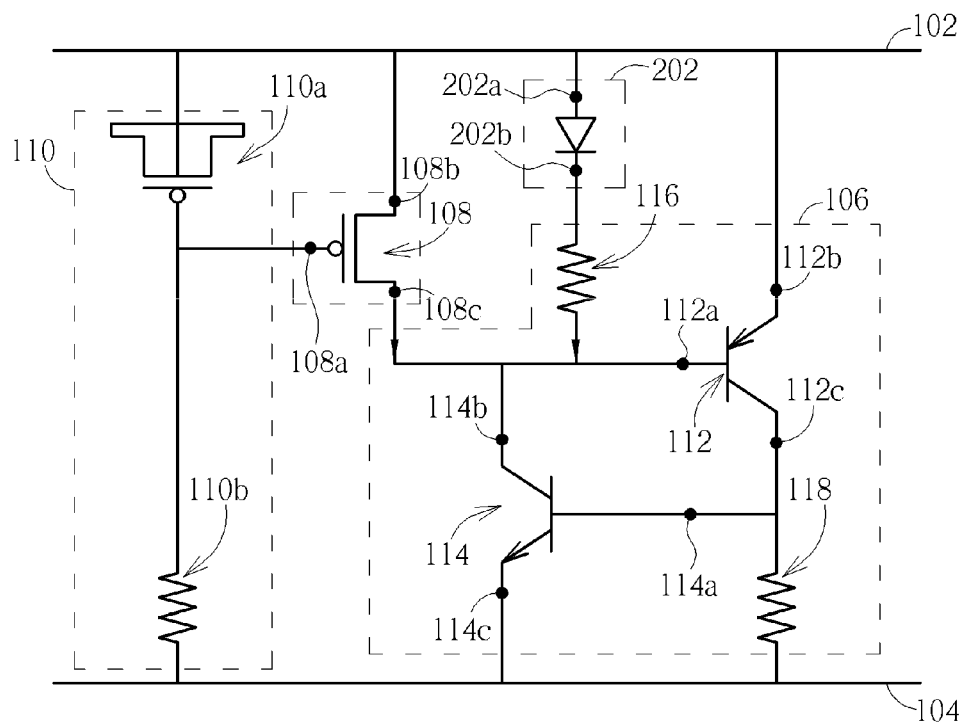
FIG. 8 is a circuit diagram illustrating an example of the ESD protection circuit according to the second preferred embodiment of the present invention.

Referring to FIG. 8 and referring to FIG. 4 together, FIG. 8 is a circuit diagram illustrating an example of the ESD protection circuit according to the second preferred embodiment of the present invention. As shown in FIG. 4 and FIG. 8, the voltage drop element 202 of this embodiment is a diode, but the present invention is not limited to this. The voltage drop element 202 having an anode 202a electrically connected to the first power rail 102 and a cathode 202b electrically connected to an end of the first resistor 116, and the other end of the first resistor 116 is electrically connected to the first base 112a. This means that the cathode is electrically connected to the N-type fourth doped region 128. The voltage drop provided by the voltage drop element 202 in this embodiment is substantially 0.7 volts.

Figure 9:
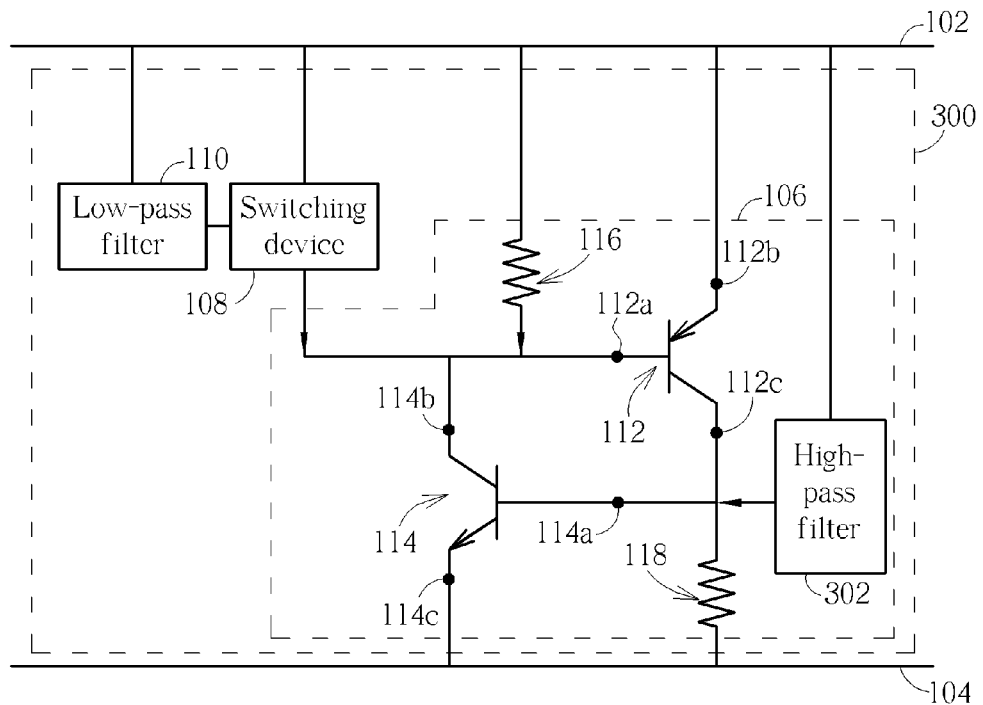
FIG. 9 is a circuit diagram illustrating an ESD protection circuit according to a third preferred embodiment of the present invention.

Referring to FIG. 9, FIG. 9 is a circuit diagram illustrating an ESD protection circuit according to a third preferred embodiment of the present invention. As shown in FIG. 9, as compared with the first preferred embodiment, the ESD protection circuit 300 of this embodiment further includes a high-pass filter 302 electrically connected between the second base 114a and the first power rail 102. Because the ESD event has very fast electrical transition in the order of several nanoseconds, the ESD current can pass the high-pass filter 302, and flow into the second base 114a. Due to the ESD current applied to the second base 114a, a trigger voltage of the ESD protection device 106 is decreased, and a turn-on speed of the ESD protection device 106 is increased. The larger the trigger voltage is, the faster the turn-on speed is. For this reason, the high-pass filter 302 increases the turn-on speed of the ESD protection device 106 to more quickly discharge the ESD current.

Figure 10:
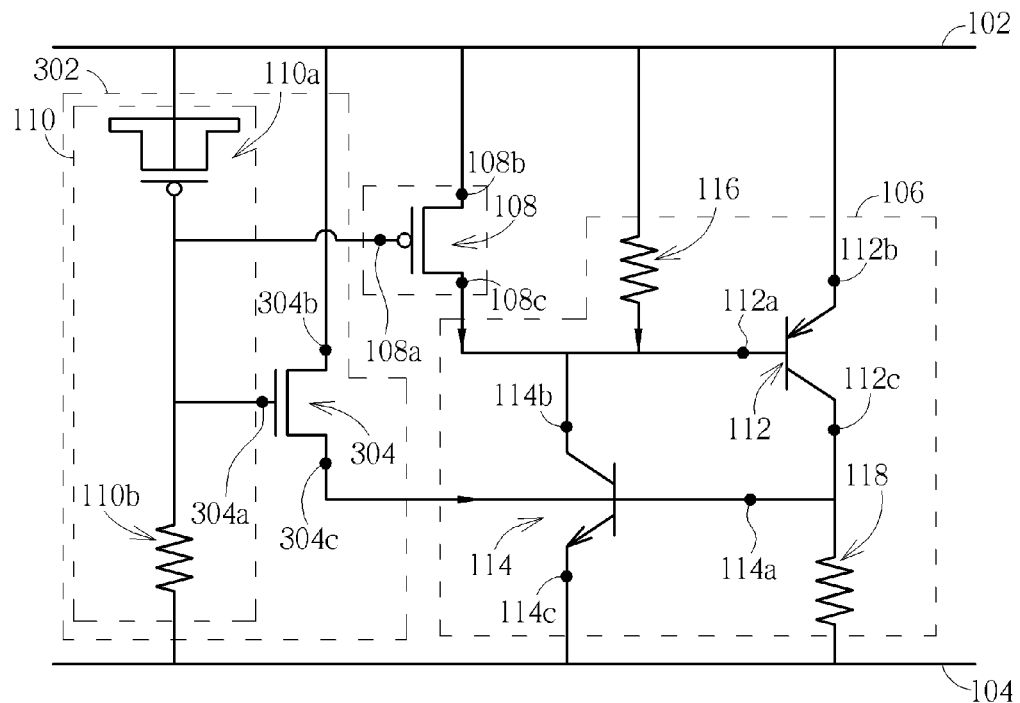
FIG. 10 is a circuit diagram illustrating an example of the ESD protection circuit according to the third preferred embodiment of the present invention.

Referring to FIG. 10, FIG. 10 is a circuit diagram illustrating an example of the ESD protection circuit according to the third preferred embodiment of the present invention. As shown in FIG. 10, the high-pass filter 302 includes the capacitor 110a, the third resistor 110b and an N-type metal-oxide-semiconductor (MOS) transistor 304, but the present invention is not limited to this. The NMOS transistor 304 has a second gate 304a, a second drain 304b and a second source 304c, and the second gate 304a is electrically connected to a connecting node of the capacitor 110a and the third resistor 110b. The second drain 304b is electrically connected to the first power rail 102, and the second source 304c is electrically connected to the second base 114a.

Figure 11:
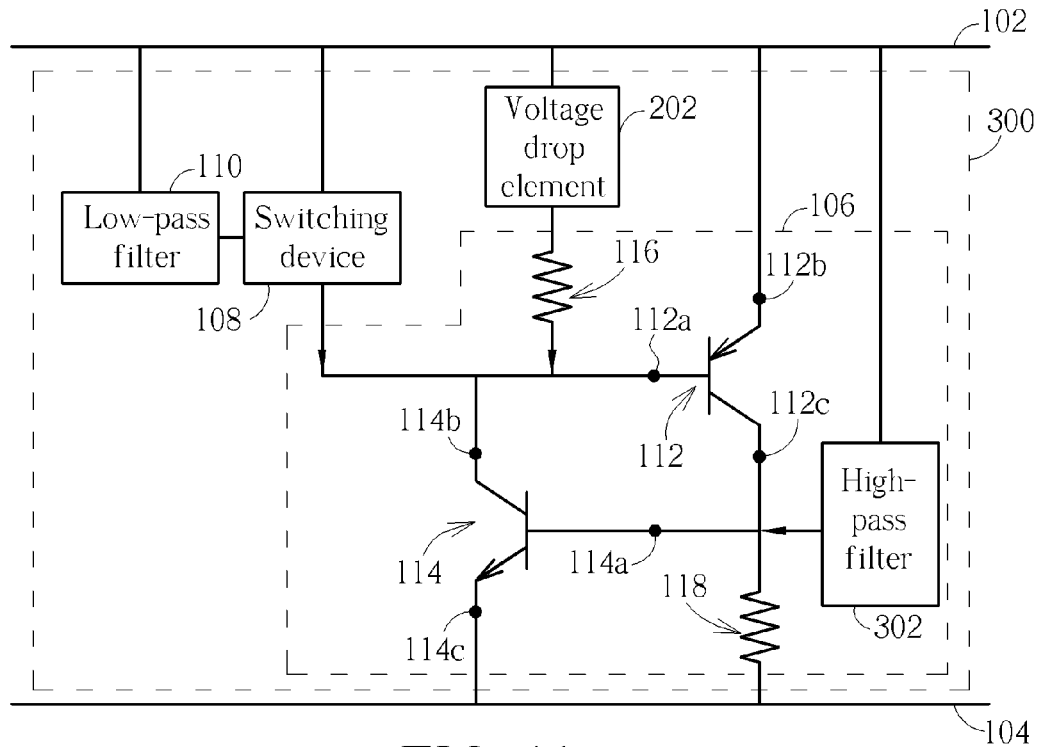
FIG. 11 is a circuit diagram illustrating an ESD protection circuit according to a fourth preferred embodiment of the present invention.
Figure 12:
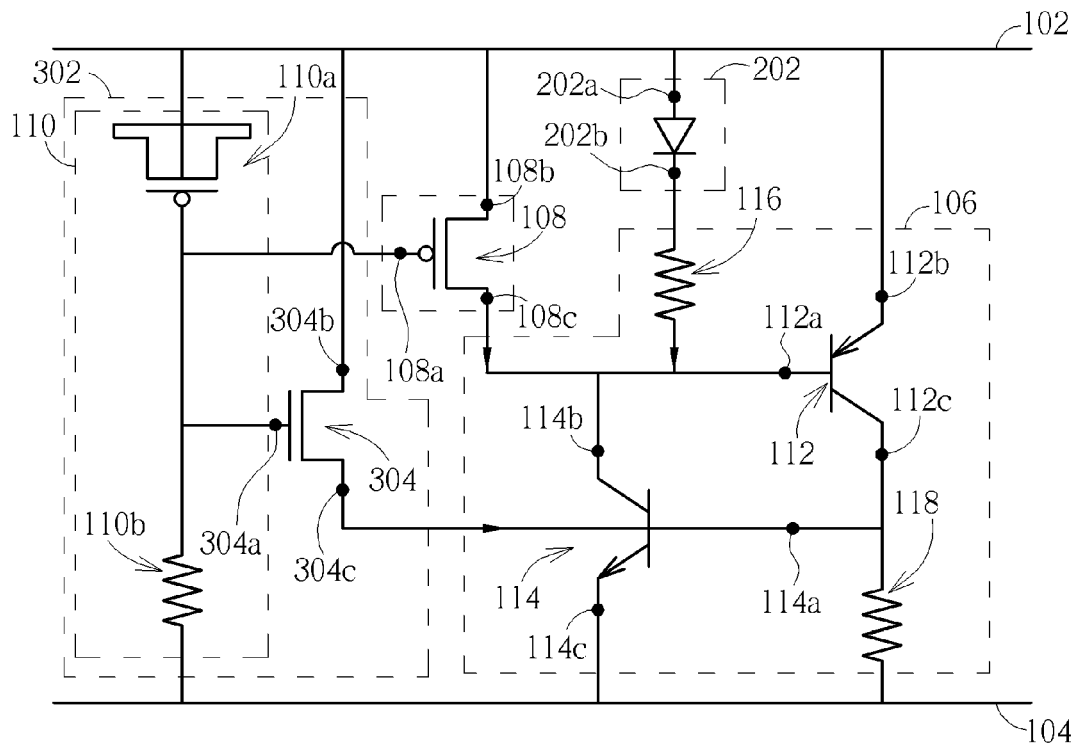
FIG. 12 is a circuit diagram illustrating an example of the ESD protection circuit according to the fourth preferred embodiment of the present invention.

Referring to FIG. 11 and FIG. 12, FIG. 11 is a circuit diagram illustrating an ESD protection circuit according to a fourth preferred embodiment of the present invention, and FIG. 12 is a circuit diagram illustrating an example of the ESD protection circuit according to the fourth preferred embodiment of the present invention. As shown in FIG. 11 and FIG. 12, as compared with the first preferred embodiment, the ESD protection circuit 400 of this embodiment further includes the voltage drop element 202 and the high-pass filter 302. In this embodiment, the voltage drop element 202 is a diode having an anode 202a electrically connected to the first power rail 102 and a cathode 202b electrically connected to the N-type third doped region. The high-pass filter 302 includes the capacitor 110a, the third resistor 110b and an NMOS transistor 304, and the NMOS transistor 304 has a second gate 304a, a second drain 304b and a second source 304c. The second gate 304a is electrically connected to a connecting node of the capacitor 110a and the third resistor 110b. The second drain 304b is electrically connected to the first power rail 102, and the second source 304c is electrically connected to the second base 114a.

Figure 13:
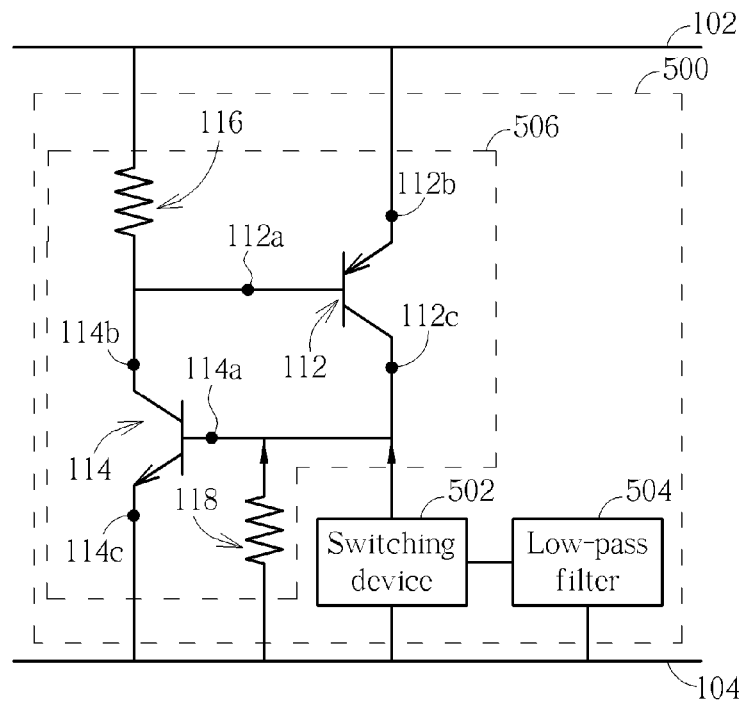
FIG. 13 is a circuit diagram illustrating an ESD protection circuit according to a fifth preferred embodiment of the present invention.
Figure 14:
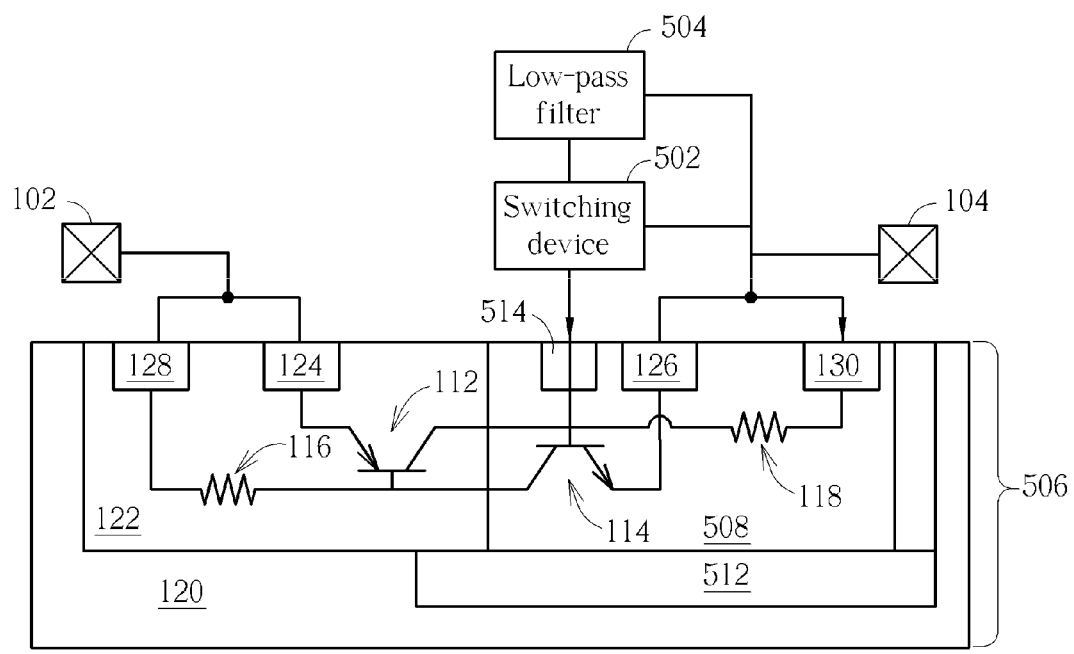
FIG. 14 is a schematic diagram illustrating a cross-sectional view of an ESD protection device according to the fifth preferred embodiment of the present invention.
Figure 15:
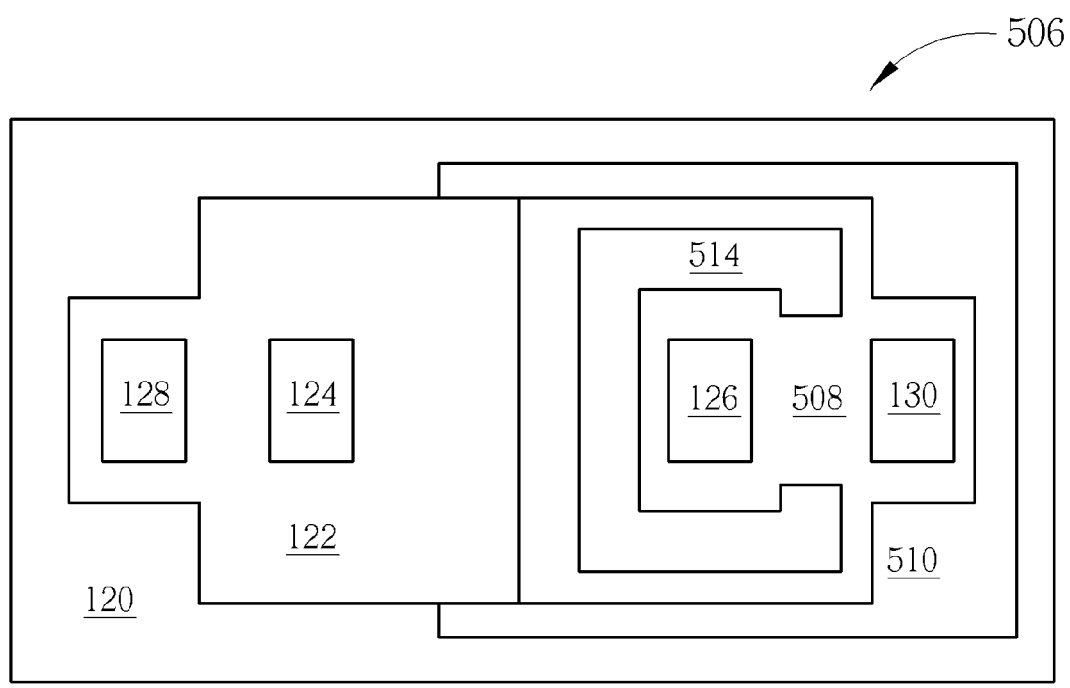
FIG. 15 is a schematic diagram illustrating a top view of the ESD protection device according to the fifth preferred embodiment of the present invention.

Referring to FIG. 13 through FIG. 15, FIG. 13 is a circuit diagram illustrating an ESD protection circuit according to a fifth preferred embodiment of the present invention; FIG. 14 is a schematic diagram illustrating a cross-sectional view of an ESD protection device according to the fifth preferred embodiment of the present invention; and FIG. 15 is a schematic diagram illustrating a top view of the ESD protection device according to the fifth preferred embodiment of the present invention. As shown in FIG. 13, as compared with the first preferred embodiment, the ESD protection circuit 500 of this embodiment includes a second switching device 502 and a second low-pass filter 504, and the ESD protection circuit 500 does not include the first switching device and the first low-pass filter. The second switching device 502 is electrically connected between the second base 114a and the second power rail 104, and the second low-pass filter 504 is electrically connected between the second power rail 104 and the second switching device 502, so that the second switching device 502 can be controlled by a signal passing through the second low-pass filter 504. Furthermore, as shown in FIG. 14 and FIG. 15, as compared with the first preferred embodiment, the ESD protection device 506 of this embodiment further includes a second well 508, a third well 510, a deep well 512 and a sixth doped region 514, but does not include the third doped region. The second well 508 has P-type, and is disposed in the P-type substrate 120 adjacent to the N-type first well 122. Furthermore, the N-type second doped region 126 and the P-type fifth doped region 130 are disposed in the P-type second well 508, and are electrically connected to the second power rail 104. The P-type second well 508 disposed between the N-type second doped region 126 and the P-type fifth doped region 130 constitutes the second resistor 118. The third well 510 has N-type, and the N-type third well 510 and the N-type first well 122 surround the P-type second well 508. The deep well 512 has N-type, and the N-type deep well 512 is disposed in the P-type substrate 120 under the P-type second well 508. The N-type deep well 512, the N-type first well 122 and the N-type third well 510 isolate the P-type second well 508 from the P-type substrate 120. The sixth doped region 514 having P-type, and the P-type sixth doped region 514 is disposed in the P-type second well 508 between the P-type first doped region 124 and the N-type second doped region 126. The P-type sixth doped region 514 is electrically connected to the second switching device 508, so that the P-type second well 508 can be electrically connected to the second switching device 508 by the P-type sixth doped region 514, and a DC voltage can be applied to the P-type second well 508 while the second switching device 502 is turned on.

When no ESD event occurs, the ESD protection circuit 500 is in a normal operation state. A DC voltage signal provided from the second power rail 104 can pass through the second low-pass filter 504, and the second switching device 502 is turned on by the DC voltage signal. Thus, a resistance of the second switching device 502 that is turned on is smaller than a resistance of the second resistor 118, and then, the DC voltage signal is transferred to the P-type second well 508 regarded as the second base 114a of the N-type BJT 114 through the second switching device 502. In the N-type BJT 114, a potential of the P-type second well 508 is equal to or smaller than a potential of the N-type second doped region 126 regarded as the second emitter 114c of the N-type BJT 114, so that the ESD protection device 506 is in off state, and no leakage current is generated in the ESD protection circuit 500. Even some noise signal is generated during the normal operation state, and the noise signal can flow into the second power rail 104 through the P-type sixth doped region 514 and the second switching device 502, so that the ESD protection device 506 can be prevented from being triggered into the latch-up state. It should be noted that the P-type sixth doped region 514 extends to partially surround the N-type second doped region 126, and the P-type sixth doped region 514 has an opening between the N-type second doped region 126 and the P-type fifth doped region 130. Furthermore, when the ESD event occurs, the ESD current pulled from the second power rail 104 cannot pass through the second low-pass filter 504 because the ESD event has very fast electrical transition in the order of several nanoseconds (ns). Accordingly, the second switching device 502 is turned off, and the ESD current flows into the second power rail 104 though the first resistor 116 formed by the P-type second well 508 that has a resistance lower than the resistance of the second switching device 502 that is turned off. Due to the second resistor 118, the potential of the P-type second well 508 is larger than the potential of the N-type second doped region 126, so that the ESD protection device 506 can be turned on to discharge the ESD current. In addition, the present invention also can add the voltage drop element and the high-pass filter into the ESD protection circuit of the fifth preferred embodiment to increase turn-on speed of the ESD protection device.

In summary, the present invention provides the switching device and the low-pass filter to be electrically connected between the power rail and the first base or second base. The low-pass filter can keep the switching device being turned on during the normal operation, and keep the switching device being turned off during the ESD event. The switching device can turn on the path from the power rail to the first base or second base, so that the potential of the first base is equal to or larger than the potential of the first emitter, or the potential of the second base is equal to or smaller than the potential of the second emitter during the normal operation. Therefore, the SCR structure formed by the ESD protection device does not be triggered into the latch-up state during the normal operation, and the problem of the SCR structure being triggered on by the noise during normal operation can be solved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An ESD protection device, comprising:
   a substrate, having a first conductive type;
   a first well, having a second conductive type and disposed in the substrate, and the first well being electrically connected to a first switching device;
   a first doped region, having the first conductive type and disposed in the first well, and the first doped region and the first well being electrically connected to a first power rail;
   a second doped region, having the second conductive type and disposed in the substrate, and the second doped region and the substrate being electrically connected to a second power rail;
   a third doped region, having the second conductive type and disposed in the first well between the first doped region and the second doped region, and the first well being electrically connected to the first switching device by the third doped region, wherein the third doped region partially surrounds the first doped region; and
   a fourth doped region, having the second conductive type and disposed in the first well, and the first doped region being disposed between the fourth doped region and the second doped region, wherein the fourth doped region electrically connects the first well and the first power rail, the first well and the fourth doped region constitutes a first resistor, and the third doped region doesn't extend to be disposed between the first doped region and the fourth doped region in an arranged direction of the first doped region and the fourth doped region;
   wherein when an ESD event does not occur, the first switching device is turned on, and a potential of the first well is larger than or equal to a potential of the first doped region; and when the ESD event occurs, the first switching device is turned off, and the potential of the first well is smaller than the potential of the first doped region.

2. An ESD protection circuit, comprising:
   the ESD protection device as claimed in claim 1; and
   a voltage drop element electrically connected between the fourth doped region and the first power rail.

3. The ESD protection circuit according to claim 2, wherein the voltage drop element is a diode, and the diode having an anode electrically connected to the first power rail and a cathode electrically connected to the first resistor.

4. The ESD protection device according to claim 1, further comprising:
   a fifth doped region, having the first conductive type, and the second doped region being disposed between the first doped region and the fifth doped region, wherein the fifth doped region electrically connects the substrate and the second power rail, and the substrate and the fifth doped region constitutes a second resistor.

5. The ESD protection device according to claim 1, wherein the first conductive type is P-type, and the second conductive type is N-type.

6. An ESD protection device, comprising:
- a substrate, having a first conductive type;
- a first well, having a second conductive type and disposed in the substrate;
- a second well, having the first conductive type and disposed in the substrate adjacent to the first well, and the second well being electrically connected to a second switching device;
- a first doped region, having the first conductive type and disposed in the first well, and the first doped region and the first well being electrically connected to a first power rail;
- a second doped region, having the second conductive type and disposed in the second well, and the second doped region and the second well being electrically connected to a second power rail, wherein the second switching device is electrically connected to the second power rail; and
- a sixth doped region, having the first conductive type and disposed in the second well between the first doped region and the second doped region, and the second well being electrically connected to the second switching device by the sixth doped region;
- wherein when an ESD event does not occur, the second switching device is turned on, and a potential of the second well is smaller than or equal to a potential of the second doped region; and when the ESD event occurs, the second switching device is turned off, and the potential of the second well is larger than the potential of the second doped region.

7. The ESD protection device according to claim 6, wherein the sixth doped region partially surrounds the second doped region.

8. The ESD protection device according to claim 6, further comprising:
- a third well, having the second conductive type, and the third well and the first well surrounding the second well; and
- a deep well, having the second conductive type and disposed in the substrate under the second well, and the deep well, the first well and the third well isolating the second well from the substrate.

9. The ESD protection device according to claim 6, further comprising a fourth doped region, having the second conductive type and disposed in the first well, and the first doped region being disposed between the fourth doped region and the second doped region, wherein the first doped region and the fourth doped region are electrically connected to the first power rail, and the first well disposed between the first doped region and the fourth doped region constitutes a first resistor.

10. The ESD protection device according to claim 6, further comprising a fifth doped region, having the first conductive type and disposed in the second well, and the second doped region being disposed between the first doped region and the fifth doped region, wherein the second doped region and the fifth doped region are electrically connected to the second power rail, and the second well disposed between the second doped region and the fifth doped region constitutes a second resistor.

11. The ESD protection device according to claim 1, wherein the third doped region is not in contact with the substrate.

12. The ESD protection device according to claim 6, wherein the sixth doped region is not in contact with the first well.

13. The ESD protection device according to claim 10, wherein the sixth doped region doesn't extend to be disposed between the second doped region and the fifth doped region in an arranged direction of the second doped region and the fifth doped region.

* * * * *